(12) United States Patent
Brunone et al.

(10) Patent No.: US 7,388,451 B2
(45) Date of Patent: Jun. 17, 2008

(54) THICKNESS TAPERED SUBSTRATE LAUNCH

(75) Inventors: David J. Brunone, Rancho Palos Verdes, CA (US); Mark Kintis, Manhattan Beach, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 80 days.

(21) Appl. No.: 11/203,772

(22) Filed: Aug. 15, 2005

(65) Prior Publication Data

US 2007/0035357 A1   Feb. 15, 2007

(51) Int. Cl.
*H01P 5/02* (2006.01)

(52) U.S. Cl. ......................... 333/34; 333/247

(58) Field of Classification Search ............... 333/34, 333/246, 247, 33
See application file for complete search history.

(56) References Cited

U.S. PATENT DOCUMENTS

| | | | | |
|---|---|---|---|---|
| 3,786,375 A | * | 1/1974 | Sato et al. | ................. 333/247 |
| 5,936,492 A | * | 8/1999 | Shingyoji et al. | ........... 333/246 |
| 6,285,269 B1 | * | 9/2001 | Ishikawa et al. | ............. 333/247 |
| 6,365,961 B1 | * | 4/2002 | Tomie | ......................... 257/664 |
| 6,737,931 B2 | * | 5/2004 | Amparan et al. | .............. 333/34 |

* cited by examiner

*Primary Examiner*—Benny Lee
(74) *Attorney, Agent, or Firm*—Tarolli, Sundheim, Covell & Tummino LLP

(57) ABSTRACT

A technique for interconnecting monolithic microwave integrated circuits (MMICS) on a substrate, and a method for fabricating substrate sections that facilitate such interconnection. A MMIC is positioned in a gap in the substrate, on which are formed conventional microwave transmission lines for purposes of MMIC interconnection. On each side of the gap, the substrate is tapered in thickness between the normal substrate thickness and the much smaller thickness of the MMIC. The transmission lines in this transition region are tapered in width as the substrate is tapered in thickness, thereby maintaining uniform transmission line characteristics, particularly the characteristic impedance of the transmission line. Small connector ribbons provide electrical connection between the tapered transmission lines and the MMIC. A method is also disclosed for fabricating multiple substrate sections for use in the structure of the invention.

9 Claims, 2 Drawing Sheets

THICKNESS TAPERED SUBSTRATE LAUNCH

BACKGROUND OF THE INVENTION

This invention relates generally to radio frequency (RF) circuitry and, more particularly to interconnection and packaging of monolithic microwave integrated circuit (MMIC) chips. There are certain applications of MMICs that are required to handle RF signals having a very wide bandwidth. For example, electronic circuits that interface with photonic communications systems can advantageously employ MMICs for amplifiers, data buffers and similar devices. Some MMICs have a thickness in the range of 2-4 mil (approximately 50-100 μm). Interconnection between MMICs or from MMICs to external components is typically handled by transmission lines formed on substrates that are approximately 10-25 mil (250-625 μm) in thickness, since thinner substrates would be much too brittle to be of practical value.

Therefore, a common packaging problem in many MMIC applications is to provide interconnecting RF transmission lines between MMICs that are 50-100 μm thick and substrates of a much greater thickness, such as 250-625 μm. One solution of the prior art is to employ ribbon interconnects that are up to 30 mil (750 μm) long, but this type of interconnect has a significant effect on bandwidth, output power and noise generated in an interconnected MMIC system. Accordingly, there is a need for an alternative solution for interconnecting MMICs with other MMICs and with external components installed on a common substrate. The present invention is directed to this need.

SUMMARY OF THE INVENTION

The present invention resides in structure for launching RF signals from a MMIC into a substrate transmission line, without the detrimental effects associated with long interconnects of the prior art. Briefly, and in general terms, the invention comprises a substrate having a continuous surface except for at least one gap; at least one MMIC disposed in the gap in the substrate, wherein the MMIC has a thickness much less than that of the substrate; at least one microwave transmission line formed over the substrate and extending up to the gap; and at least one interconnect ribbon extending from the MMIC to the microwave transmission line. The substrate includes at least one transition region in which the substrate is gradually tapered in thickness from a maximum substrate thickness to a reduced thickness that is approximately the same as the thickness of the MMIC. That portion of the microwave transmission line that is formed on the transition region of the substrate is gradually tapered in width as the substrate transition region is tapered in thickness, thereby providing a microwave transmission line transition of substantially uniform characteristic impedance.

In a disclosed embodiment, the transition region of the substrate tapers in thickness from approximately 10-25 mil (250-625 μm) to approximately 2-4 mil (50-100 μm), and wherein the interconnect ribbon is only approximately 3 mil (75 μm) in length. The microwave transmission line in the transition region of the substrate is tapered in width to such a degree that the characteristic impedance of the transmission line remains near 50 Ω over each transition region, thereby minimizing insertion loss and providing desirable noise characteristics. Ideally, the substrate region includes a substrate transition region on each side of the gap in the substrate, and width-tapered microwave transmission lines are formed on each of the transition regions, to make RF contact with the MMIC from both sides of the substrate gap.

The invention may also be defined in terms of a method for fabricating multiple substrate sections to facilitate interconnection of microwave integrated circuits (MMICs). The method comprises taking a substrate of uniform thickness; forming in the substrate a plurality of parallel recesses, wherein each recess has a vertical sidewall and an adjoining sloping wall extending from the bottom of the vertical sidewall to the substrate surface. The substrate has a plurality of flat surface segments between adjacent recesses. The method further comprises forming at least one microwave transmission line on each of the flat surface segments; forming a continuation of the microwave transmission line on the sloping wall of each recess, wherein the continuation of the microwave transmission line is tapered to a progressively smaller width toward the bottom of each recess; and then cutting the substrate into sections, by cutting in the plane of each of the vertical sidewalls. This provides multiple tapered substrate sections with tapered transmission lines formed on them, each section having a uniform thickness portion and a tapered thickness portion. Finally, the method comprises positioning a pair of the substrate sections to form a gap between their tapered thickness portions; positioning at least one MMIC in the gap; and connecting the MMIC to the microwave transmission lines by a connecting ribbon.

It will be appreciated from the foregoing summary that the present invention represents a significant advance in the field of MMIC packaging, in that connections to and from MMIC devices can be made using conventional transmission lines, but without significant loss or discontinuity caused by the thin cross-section of the MMIC relative to a conventional substrate. Other aspects and advantages of the invention will become apparent from the following more detailed description, taken in conjunction with the accompanying drawings.

DETAILED DESCRIPTION OF THE INVENTION

Figure 1:
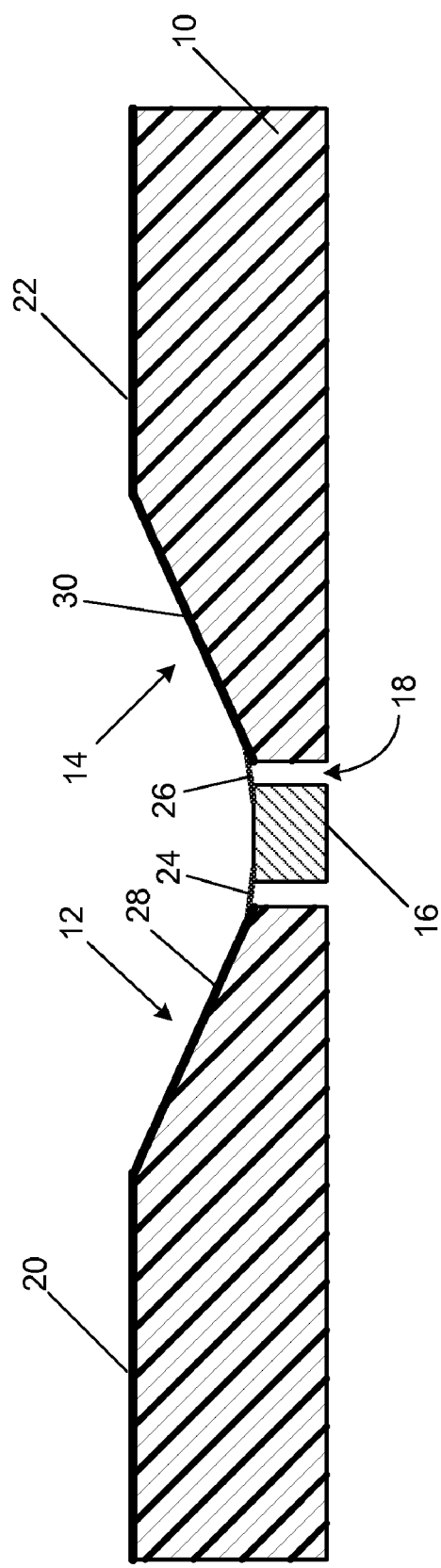
FIG. 1 is a cross-sectional view of a substrate structure formed in accordance with the present invention to facilitate connection with monolithic microwave integrated circuits (MMICs).

As shown in the drawings for purposes of illustration, the present invention is concerned with launching RF signals from a monolithic microwave integrated circuit (MMIC) into a transmission line on a substrate, or vice versa. In accordance with the invention, interconnection between the MMIC and a conventional transmission line is effected by a substrate transition region that is tapered in thickness and a transmission line segment that is correspondingly tapered in width, to maintain a practically uniform characteristic impedance over the transition region.

The concept of the invention is depicted in the cross-sectional view of FIG. 1. A substrate 10 is shown as having two thickness-tapered transition regions 12 and 14 on either side of a MMIC 16 positioned in a recess or gap 18 in the substrate. As noted above, the thickness of the MMIC may be in the range of 2-4 mil (50-100 μm), and the substrate 10 is typically of thickness 10-25 mil (250-625 μm), depending on the material used. Conventional microwave transmission lines 20 and 22 on the substrate 10 provide connections to other MMICs or to other microwave components. Interconnection between the MMIC 16 and the transmission lines 20 and 22 is effected by a combination of very short ribbons 24 and 26, typically 0.5 ×3.0 mil (12.5 ×75 μm) bridging the gaps between the MMIC and the tapered regions 12 and 14 of the substrate, together with two tapered transmission line transitions 28 and 30 connecting the short ribbons 24 and 26 to the conventional transmission lines 20 and 22. The transmission line transitions 28 and 30 are tapered in width from the full width of the transmission lines 20 and 22 to the narrower width of the short ribbons 24 and 26. The transmission line transitions 28 and 30 maintain a uniform characteristic impedance, such as 50 Ω (ohms), as the substrate is tapered in thickness. Thus there is little or no electrical discontinuity over the transition from the transmission lines 20 and 22 and the MMIC interconnecting ribbons 24 and 26. Moreover, because these interconnecting ribbons are kept to a very short length, any effect on the bandwidth or noise characteristics of the interconnection is kept to a minimum.

Figure 2:
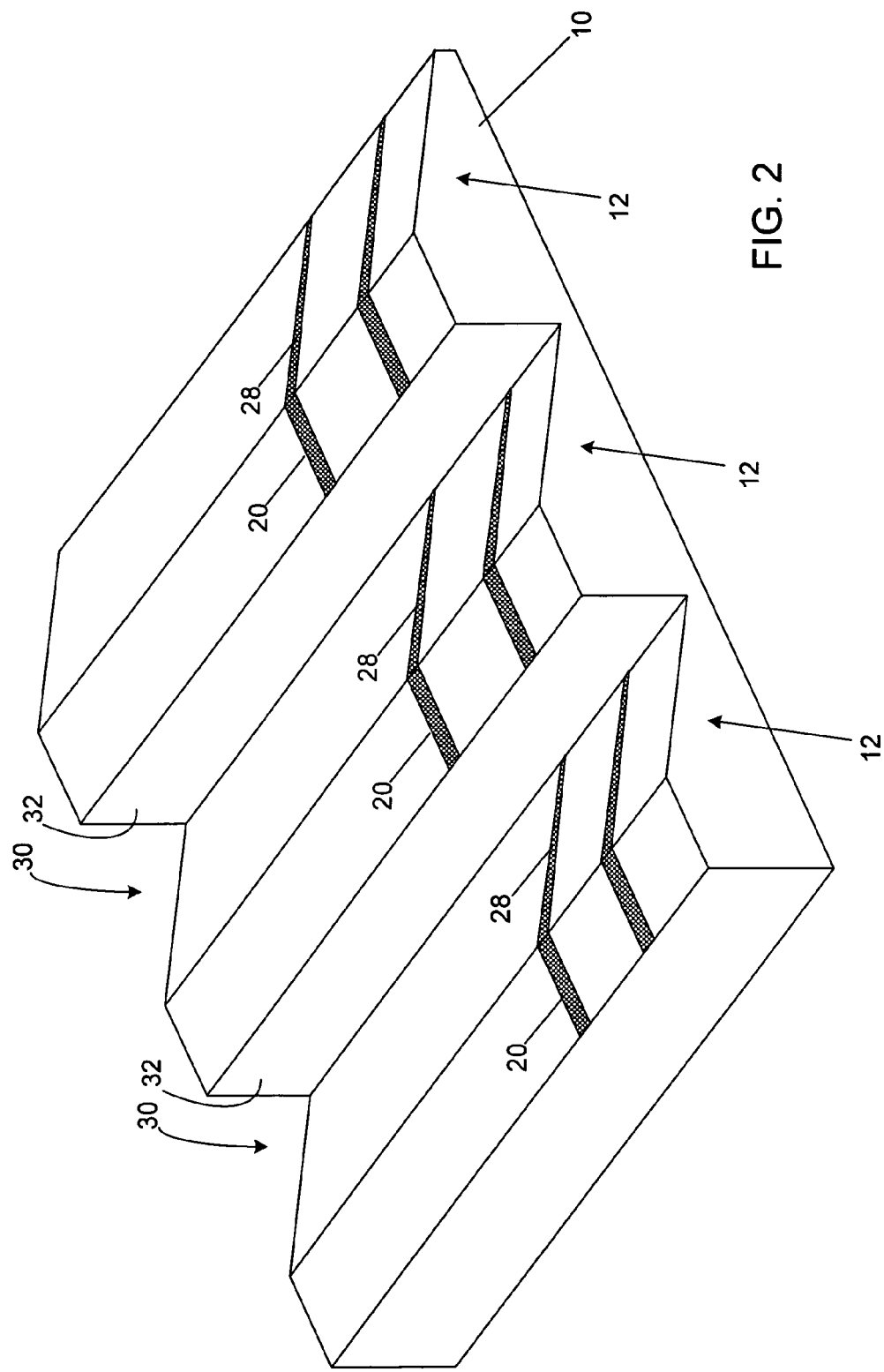
FIG. 2 is a perspective view of a substrate having three tapered sections in accordance with the invention.

FIG. 2 illustrates how multiple sections of the substrate 10 may be conveniently fabricated. Beginning with a full-thickness substrate, multiple tapered sections 12 are formed by ion etching parallel channels 30, each having one vertical wall 32 and one sloping wall forming the tapered section 12 (or 14). Segments of microwave transmission lines are formed by pattern plating the substrate 10 as shown. These transmission line segments include portions of the lines 20 (or 22) on the full-thickness regions of the substrate 10, and width-tapered segments 28 and 30 formed on the thickness-tapered regions 12 (or 14). The multiple substrate sections, three of which are shown in FIG. 2, are then separated by cutting, such as by conventionally sawing the substrate in the same plane as each of vertical faces 32. The resulting substrate segments may then be assembled to form an appropriately sized gap (18 in FIG. 1) to accommodate the MMIC 16. Although the substrate segments are shown in FIG. 2 as being relatively short in the length direction of the transmission lines, it will be understood that they may be made or any desired length, depending on the MMIC application. Similarly, the width dimension of the substrate segments (perpendicular to the transmission line length) may be wide enough to accommodate additional tapered transmission lines, connecting with additional MMICs positioned in the same gap between substrate sections.

It will be appreciated from the foregoing that the present invention represents a significant advance in the field of MMIC packaging techniques. In particular, the invention provides an improved structure for interconnecting MMICs with only minimal effect on performance characteristics such as bandwidth and noise. In addition, the invention provides a convenient technique for fabricating substrate transition sections for making RF connections with MMICs. It will also be appreciated that although a specific embodiment of the invention has been illustrated and described in detail for purposes of illustration, various modifications may be made without departing from the spirit and scope of the invention. Accordingly, the invention should not be limited except as by the appended claims.

The invention claimed is:

1. An interconnect structure for establishing connections with monolithic microwave integrated circuits (MMICs), comprising:
   a substrate having a continuous surface except for at least one gap;
   at least one MMIC disposed in the gap in the substrate, wherein the MMIC has a thickness much less than that of the substrate;
   at least one microwave transmission line disposed over the substrate and extending up to the gap; and
   at least one interconnect ribbon that is approximately 3 mil (75 μm) in length extending from the MMIC to the microwave transmission line;
   wherein the substrate includes at least one transition region in which the substrate is gradually tapered in thickness from a maximum substrate thickness of approximately 10-25 mil (250-625 μm) to a reduced thickness of approximately 2-4 mil (50-100 μm) that is approximately the same as the thickness of the MMIC; and
   wherein that portion of the at least one microwave transmission line that is disposed on the at least one transition region of the substrate is gradually tapered in width as the at least one transition region is tapered in thickness, thereby providing a microwave transmission line transition of substantially uniform characteristic impedance.

2. An interconnect structure as defined in claim 1, wherein the substrate includes the at least one substrate transition region on each side of the gap in the substrate, and the portion of the at least one width-tapered microwave transmission line which is width tapered being disposed on each of the at least one transition region, to make RF contact with the MMIC from both sides of the substrate gap.

3. An interconnect structure as defined in claim 1, wherein the at least one microwave transmission line in the at least one transition region of the substrate is tapered in width to such a degree that the characteristic impedance of the transmission line remains near 50 Ω over each of the at least one transition region, thereby minimizing insertion loss and providing desirable noise characteristics.

4. A method for minimizing the effect of interconnects needed to establish RF communication with a monolithic microwave integrated circuit (MMIC) disposed in a gap in a substrate, the method comprising:
   providing the substrate with the gap large enough to accommodate a MMIC of substantially less thickness than that of the substrate;
   forming at least one transition region in the substrate, in which the substrate thickness is tapered from a maximum value of approximately 10-25 mil (250-625 μm) to a minimum value of approximately 2-4 mil (50-100 μm), which is approximately equal to the thickness of the MMIC;
   forming at least one microwave transmission line on the substrate, including a tapered transmission line section in the at least one transition region, wherein the tapered transmission line section has a width that is progressively reduced as the substrate thickness is reduced, thereby providing a substantially uniform transmission line characteristic impedance; and
   connecting the MMIC to the tapered transmission line section with a relatively short conductive ribbon, which minimizes insertion loss.

5. A method as defined in claim 4, wherein the step of forming the at least one transition region comprises forming the at least one transition region on each side of the gap in the substrate.

6. An interconnect structure for establishing connections with monolithic microwave integrated circuits (MMICs), comprising:

a first substrate segment that includes a first planer region that has a substantially planer surface with a maximum substrate thickness integral with a first transition region that is gradually tapered in thickness and from the maximum substrate thickness at the first planer region to a reduced thickness and having a first transmission line continuously disposed over the first planer region and the first transition region, the first transmission line being gradually tapered in width as the first transition region is tapered in thickness, thereby providing the first transmission line with substantially uniform characteristic impedance;

a second substrate segment that includes a second planer region that has a substantially planer surface with a second maximum substrate thickness integral with a second transition region that is gradually tapered in thickness from the second maximum substrate thickness at the second planer region to a second reduced thickness and having a second transmission line continuously disposed over the second planer surface and the second transition region, the second transmission line being gradually tapered in width as the second transition region is tapered in thickness, thereby providing the second transmission line with substantially uniform characteristic impedance, the second substrate segment being a separate structure from the first substrate segment and spaced apart from the first substrate segment by a gap;

at least one MMIC disposed in the gap between the first and second substrate segments, wherein the MMIC has a thickness much less than each of the maximum substrate thickness of the first substrate segment and the second maximum substrate thickness of the second substrate segment;

a first interconnect ribbon extending from the MMIC to the first microwave transmission line;

a second interconnect ribbon extending from the MMIC to the second microwave transmission line.

7. The interconnect structure of claim 6, wherein the first and second transmission lines disposed on each of the first and second transition regions are tapered in width to such a degree that characteristic impedance of the first and second transmission lines remain at approximately 50 Ω over each of the first and second transition regions of the first and second substrate segments, thereby minimizing insertion loss and providing desirable noise characteristics.

8. The interconnect structure of claim 6, wherein the first and second transmission lines extend from the first and second transition regions, respectively, over the respective first substrate segment and second substrate segment.

9. The interconnect structure of claim 6, wherein the first substrate segment further includes a plurality of parallel first transmission lines being gradually tapered in width as the first transition region is tapered in thickness, and the second substrate segment further includes a plurality of parallel second transmission lines being gradually tapered in width as the second transition region is tapered in thickness with a respective MMIC of a plurality of MMICs disposed in the gap and coupled to respective first and second transmission lines of the plurality of first and second transmission lines.

* * * * *